United States Patent [19]

Ferrigno

[11] 4,068,289

[45] Jan. 10, 1978

[54] DIMMER WITH INCREASED SWITCHING CAPACITY

[75] Inventor: William L. Ferrigno, Peacedale, R.I.

[73] Assignee: General Electric Company, New York, N.Y.

[21] Appl. No.: 671,516

[22] Filed: Mar. 29, 1976

Related U.S. Application Data

[63] Continuation of Ser. No. 491,982, July 25, 1974, abandoned.

[51] Int. Cl.² .............................................. H05K 7/20
[52] U.S. Cl. ..................................... 361/389; 361/387; 174/16 R
[58] Field of Search .......................... 357/81; 200/289; 334/85; 174/15 R, 16 R, DIG. 5; 338/51, 57, 59, 159, 162, 197; 317/99, 100, 120; 361/386–389

[56] References Cited

U.S. PATENT DOCUMENTS

| | | | |
|---|---|---|---|
| 3,058,020 | 10/1962 | Balan | 174/16 R |
| 3,676,745 | 7/1972 | Traweek | 317/100 |
| 3,684,925 | 8/1972 | Noff, Jr. | 317/100 |
| 3,798,506 | 3/1974 | English | 317/100 |
| 3,801,874 | 4/1974 | Stefani | 317/100 |

*Primary Examiner*—Gerald P. Tolin
*Attorney, Agent, or Firm*—Paul E. Rochford; Walter C. Bernkopf

[57] ABSTRACT

A dimmer of high wattage capacity is provided and incorporates as a component thereof a dimmer of lower wattage capacity. The combination of this invention makes possible a higher wattage dimmer at a relatively lower cost than previously feasible. This higher wattage dimmer incorporates in combination, a standard lower wattage dimmer, having a low cost based on high volume production, coupled with a relatively large heat sink. The heat sink is formed to combine with and bear against the lower wattage dimmer in heat receiving relationship. A lower cost higher wattage dimmer accordingly results from this combination.

4 Claims, 8 Drawing Figures

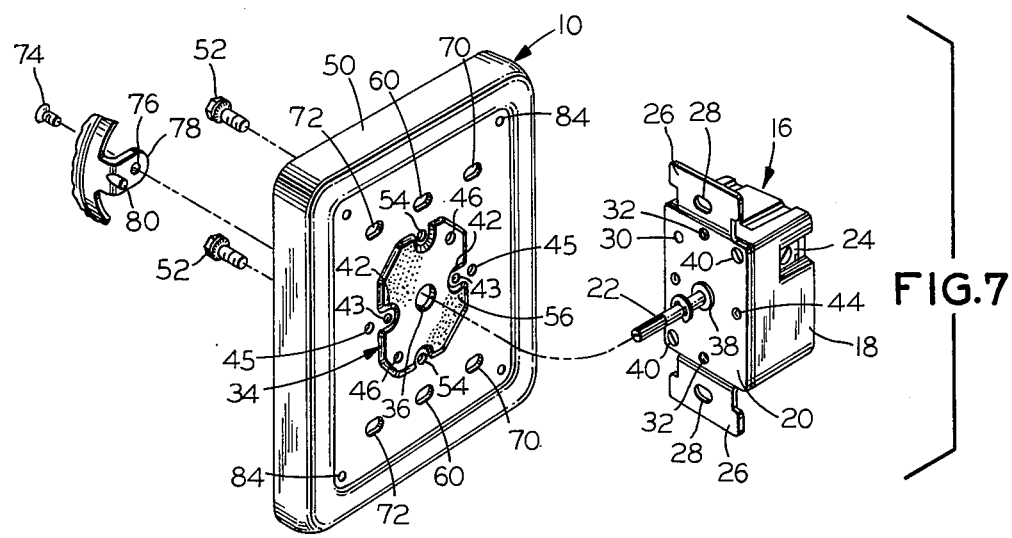
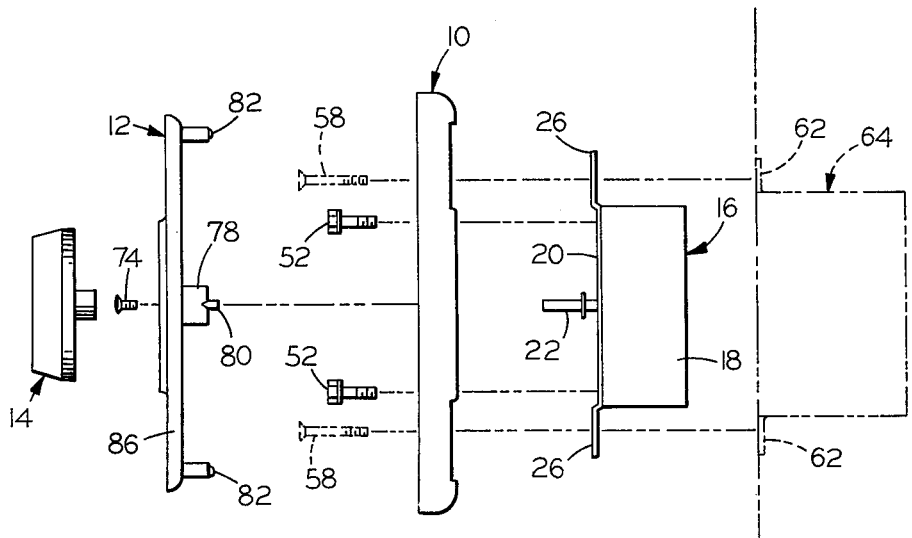

DIMMER WITH INCREASED SWITCHING CAPACITY

This is a continuation, of application Ser. No. 491,982, filed 7-25-74 now abandoned.

BACKGROUND

The present invention relates to a dimmer unit for wall mounting having a construction suitable for large volume manufacture but having a power handling capacity of a level higher than dimmer units conventionally manufactured in high volume.

It is known that dimmer units are employed in homes and other buildings for controlling the level of lighting within such buildings by providing a solid state switching action. Such solid state switching action can occur during each half cycle of the normal 60 cycle voltage alternation of the current supply. This switching permits a portion only of the power which could otherwise flow during each half cycle to be in fact transmitted to the lighting device. Such switching is accomplished by a solid state device incorporated within a phase control switching circuit of the dimmer unit.

The circuit which controls the solid state switching is enclosed within an insulating housing and the housing is of a size to permit mounting within a single standard wall box. A dimmer unit may be mounted initially by an electrician in a conventional wall box or an electrician may replace an ON-OFF switch which has been previously mounted in such a wall box. It is important in the use of dimmer devices in such wall box applications that they not occupy more total enclosed volume in the wall box than is available therein and which is conventionally occupied by a standard ON-OFF switch together with the wire leads and connectors of the switch.

One reason for the widespread use of dimmer units is that it has been found technically feasible to build dimmers in such fashion that it is possible to use them to replace conventional ON-OFF switches in conventional wall boxes. To make such replacement economically practical, there has been developed as an economical article of commerce a dimmer switch unit having a metal mounting strap and having an insulating housing from which two wire leads or two wire screw terminals extend. In the conventional dimmer unit the solid state compartment, which may normally be a triac or quadrac, is in thermal communication with the metal mounting strap but is electrically isolated from this metal mounting strap.

It has been found to be quite important in the substitution by the average homeowner of dimmer units for standard ON-OFF switching units, that the overall dimmer device fit conveniently and easily within the conventional wall box enclosure from which the ON-OFF switch has been removed. One reason for this is that a replacement is the simplest arrangement by which a homeowner may convert an ON-OFF lighting circuit to a dimmer circuit. The homeowner simply removes the switch plate, and then removes the ON-OFF switch by demounting it from the wall box. Next he disconnects the two electric supply wires connected to the switch. He then connects the same two electric supply wires to a dimmer switch unit, and mounts the dimmer unit in the wall box in place of the switch. All that remains to be done is to replace the same switch plate and press the dimmer control knob into place.

One of the advantages of such economical solid state dimmer units which can be fitted within the conventional wall box is that millions of average homeowners can convert their lighting controls to dimmer controls as simply as they can replace a wall switch. Often this is done by an electrician but more often it is done by the homeowner because of the inherent simplicity of the change. There is no resulting difference from the replacement by a dimmer unit other than the presence of the conventional dimmer control knob used in regulating the lighting level through the dimmer unit.

Consequently a very substantial number of dimmer units having the capability of controlling about 600 watts are installed each year. These units are of conventional construction, fit in the conventional wall box, and may be covered by the conventional wall plate without detracting from the appearance of the control article at the switch location. Several millions of such 600 watt devices are installed each year by homeowners and this has been the case for a number of years.

In many applications, it is desirable to employ dimmers of higher wattage rating but the cost of such dimmers is sufficiently high so that there is a tendency for a person who wishes to use, for example 1000 watts of control to purchase two of the lower rated 600 watt dimmers and to use these in adjoining wall boxes as the control element providing the 1000 watt load can be split into two separate loads, as dimmers cannot be operated in parallel. When a 600 watt dimmer is used in a wall box adjacent to another 600 watt dimmer, both dimmers must be derated so that the use of two side-by-side dimmers in a wall installation provides about 1000 watts of control. The use of two dimmers is most suitable for new building construction as separate wiring must extend from the installed dimmers to the lighting loads to be controlled and such separate wiring can be installed most efficiently and at lowest cost before the walls and other interior of a building are formed into place. Rewiring a building after it is finished to provide separate wires to separate loads is more costly and sometimes simply not feasible economically.

The conventional No. 14 wire used in building construction will handle 15 amperes or 1800 watts of power at the 120 voltage level commonly used. Accordingly, the wire in the control circuit used for control of 600 watts is capable of handling much higher wattage. The 600 watt dimmer is the product most commonly installed primarily because the 600 watt control capacity is sufficient to handle most light fixtures controlled by a wall switch. Further the 600 watt capacity represents the practical operating wattage level at which heat from the solid state device can be adequately dissipated from an aluminum mounting bracket within a standard wall box, although the 600 watt rating is below the switching capability of the solid state device itself. Also, the 600 watt dimmer can be installed as a full mechanical substitute of an ON-OFF switch. Once installed it is completely covered by a conventional wall switch plate as explained above and the plate may be for example the one previously used in covering the ON-OFF switch.

Because of such ready convertability of such switches to in-wall dimmers, they are produced in very large numbers. The advantages of such large volume production are made available to the purchasing public. One such advantage is the lower cost of such in-wall dimmer devices to the public because of the lower cost or manufacture which results from the higher number manufactured.

In situations in which a higher lighting load, above about 600 watts, is to be controlled by a dimmer, it is not economically feasible to alter the wiring to employ more than one 600 watt dimmer. A higher rated dimmer may be installed in a single wall box. Such higher rated dimmers conventionally have heat dissipation fins or heat sinks which are external to the wall surface. Also such higher rated dimmers are produced in smaller numbers at substantially higher cost than the more standard lower wattage in-wall dimmers.

OBJECTS OF THE INVENTION

It is accordingly one object of the present invention to provide a higher wattage dimmer which takes advantage of the higher volume production methods to achieve lower cost.

Another object is to provide a higher wattage dimmer of high reliability, economy, and efficiency.

A further object of the invention is to provide a novel method of manufacture of a higher wattage dimmer.

Other objects will be in part apparent and in part pointed out in the description of the invention which follows.

SUMMARY OF THE INVENTION

Objects of the present invention may be achieved by providing a dimmer article of the conventional in-wall configuration including an insulating housing adapted to be mounted into a single wall box, a metal mounting plate having a heat generating solid state electric control device thermally linked to but electrically isolated from the mounting plate. The housing also contains phase control circuitry suitable for regulating the amount of power which passes through the solid state control device. The conventional in-wall dimmer article is given a higher power rating capacity by affixing to the mounting plate thereof a geometrically conforming thermal sink plate which sink substantially increase the capacity of the available heat sink into which the solid state control device can yield its heat during operation. The combined geometrically conforming enlarged heat sink plate and the conventional dimmer are assembled however for mounting into a conventional wall box.

DESCRIPTION OF THE FIGURES

FIG. 6 is a top plan view of a face plate for assembly to a heat sink of a dimmer article as provided herein.

FIG. 7 is an exploded view of a heat sink plate and a fragment of a cover face plate poised for assembly to a conventional dimmer article.

FIG. 8 is a semi-schematic rendering of various portions of a high wattage dimmer in exploded formations and showing their relations to a conventional wall box in which the dimmer article may be mounted.

DESCRIPTION OF THE PREFERRED EMBODIMENT

Figure 1:
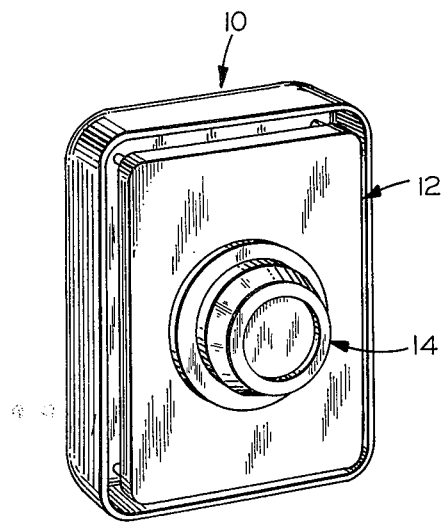
FIG. 1 is a perspective view of the front face of a dimmer article formed in accordance with the present invention.
Figure 2:
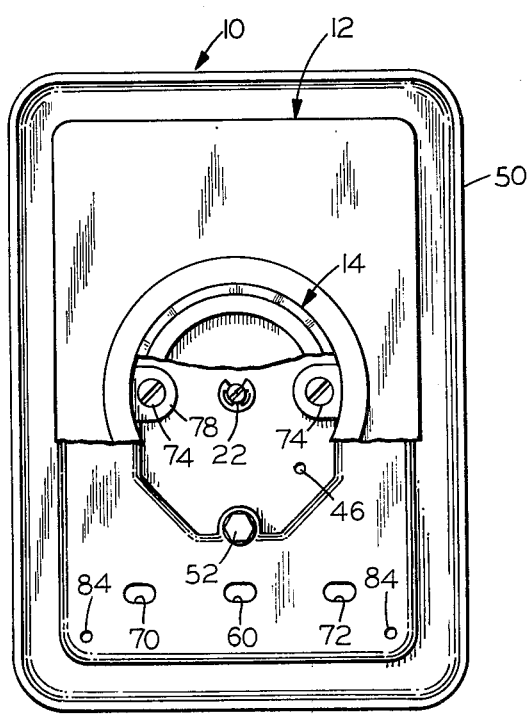
FIG. 2 is a front elevation of a dimmer as illustrated in FIG. 1 but in part cut away to show the mounting of several of its elements.
Figure 3:
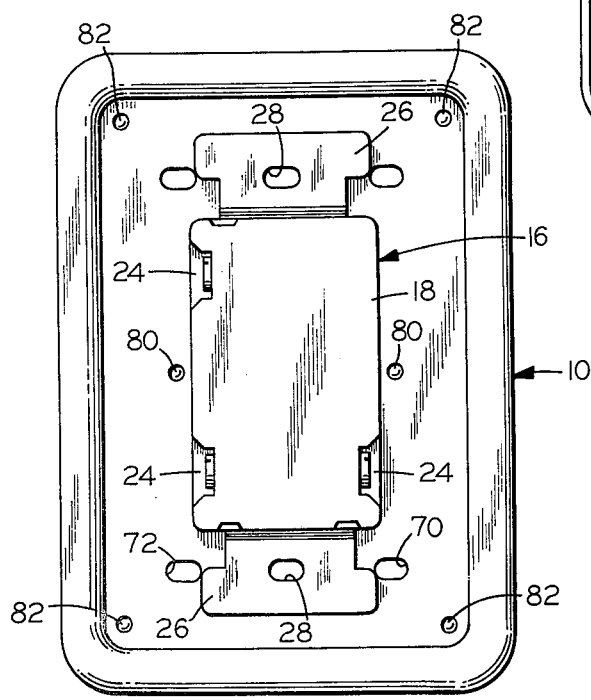
FIG. 3 is a rear elevation of the dimmer as illustrated in FIG. 2.
Figure 4:
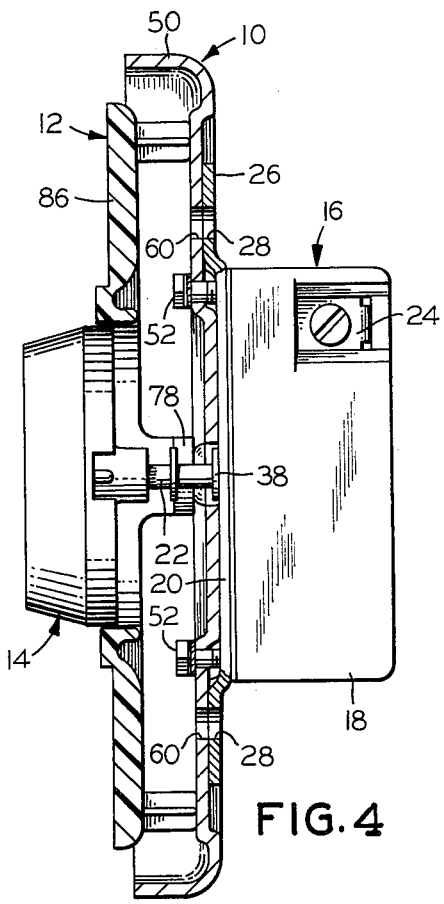
FIG. 4 is an enlarged side elevation in part a section of a dimmer article as illustrated in FIGS. 1, 2, and 3.

Referring to FIGS. 1-3, a dimmer as provided pursuant to this invention includes a heat sink plate 10, a decorative face plate 12, a control knob 14 and a conventional in-wall dimmer 16. The conventional dimmer 16 includes an insulating housing 18 and a mounting plate 20. The mounting plate provides a closure for an access opening to the housing interior over which it fits and may be described as a closure plate. A control shaft 22 extends through the mounting plate 20 at the face of the dimmer and a number of screw terminals 24 are located in openings in the rear of the housing 18. These screw terminals constitute electric supply means connected to the dimmer into an electric circuit to be controlled.

The mounting plate 20, which is more conventionally termed a mounting strap, has two end portions 26, each of which has a mounting hole 28 located therein. The mounting strap 20 also has a rivet 30 which mounts a heat generating solid state control device, not shown, on the inner surface of the strap. A conventional phase control circuit within the dimmer 16 connects the screw terminals to the solid state device. Two threaded holes 32 provide means for mounting a conventional wall plate to the mounting strap after the dimmer is mounted within a conventional wall box in prior art use of such a dimmer device.

However, pursuant to this invention, a special wall plate is provided to serve the dual function of being both a wall plate cover for the mounting strap of the dimmer, and of also being a heat sink. The special wall plate 10 serves the function of providing a very substantial increase in the heat absorbing capacity of the mounting plate of the conventional dimmer 16 when the special heat sink plate 10 is used in combination with the conventional in-wall dimmer 16.

The heat sink plate 10 is made up of a thermal contact surface 34 which surface is shaped to bear against and provide an intimate thermal contact with the external surface of the mounting strap 20. In this regard, the thermal contact surface 34 has such shaped, recessed and cutout portions, as evident from FIG. 7, that there is no opportunity for the thermal contact surface 34 to remain out of thermal contact with the external surface of mounting strap 20. Thus for example, the center hole 36 of thermal contact portion 34 is cut out to be larger than the shaft 22 and also larger than the washer 38 which sits against mounting plate 20.

The corners of the thermal contact surface 34 are beveled so that there will be no interference between the thermal contact surface with corner assembly screws 40. These screws 40 are used to assemble the mounting plate 20 to the insulating housing 18 of the dimmer. Further, there are cutout side portions 42 in the thermal contact surface 34 as it is feasible in this way to avoid an interfering contact between the contact surface 34 and the rivet ends 44. The rivets 44 are used in assembling the conventional internal portions of the dimmer phase control mechanism, not shown, to the mounting plate 20. Further, the recesses 46 in the thermal contact surface 34 are located to permit surface 34 to be spread free of any projection of rivet 30 above the surface of the mounting plate 20. The portions of the surface 34 which remains flat after all of the recesses needed to avoid interfering projections from surface 20 is that portion of the surface which is maintained in high thermal contact with the mounting plate 20. Outside the surface 34, other portions of a relatively large heat sink plate 10 extend to occupy a total area several times larger than the surface 34 itself and in fact than the surface of mounting plate 20 of dimmer 16. Generally the heat sink should be larger than and more massive than mounting bracket 20. It is preferred in order to raise the dimmer rating from 600 watts to 1000 watts to have a heat sink plate which has a mass approximately five times larger than that of the strap 20 as the strap is illustrated in the accompanying drawings.

For convenience of form and to limit the overall outward extension of the heat sink 10, its outer boundaries may be formed into the shallow raised lips 50 so that the heat sink plate 10 has the overall form of a relatively shallow rectangular dish or similar container.

The actual mounting of the heat sink plate 10 to strap 20 is accomplished with the assembly screws 52 which screws pass through the screw holes 54 in sink plate 10 and are threaded tightly into the threaded assembly holes 32 in the face of strap 20. A coating 56 of heat transfer material may be provided on the surface 34 to ensure greater thermal contact between surface 34 and that of strap 20 where contact actually exists. Once the thermal contact surfaces are pressed together in heat transfer relation, it is possible to mount the entire resultant higher wattage dimmer to a conventional wall box as by screws 58 shown in phantom in FIG. 8 in their relative position for passing through the screw holes 60 (see FIG. 7) of plate 10 and the aligned holes 28 of strap 20. Such screws 58 are threaded into the threaded holes not shown in the tab ends 62 of a wall box 65 also shown in phantom in FIG. 8. As described, the combination of heat sink 10 and dimmer 16, once assembled, may be mounted into a conventional single standard wall box by use of the screws 58 extending through the aligned holes 60 and 28. Alternatively, where a double wall box is employed, the mounting screw 58 may be employed in the spaced pairs of mounting screw holes 70 or 72.

Figure 5:
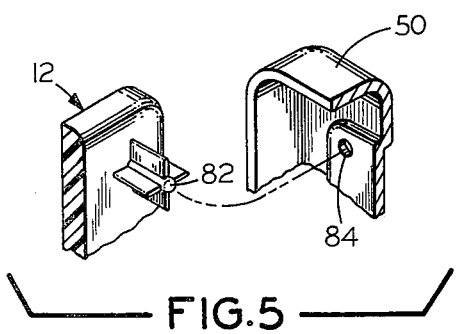
FIG. 5 is a detailed view in part in section of one construction of a corner portion of a heat sink as illustrated in the upper portion of FIG. 4.

After the higher wattage dimmer has thus been mounted in a wall box 64, the cover plate 12 may be assembled to the dimmer by the cover plate assembly screws 74. In FIG. 7, a portion only of the cover plate 12 is illustrated and the assembly screw 74 is shown aligned with a screw hole 76 in a mounting tab 78 of the cover plate. The screw 74 is one of a pair which is screwed into the threaded holes 43 in the heat sink 10. A boss 80 formed on tab 78 is inserted into holes 45 in sink 10 and provides an effective anti-torsion member which assists in keeping the cover plate 12 in alignment with the heat sink plate 10. Good registry of the cover plate 12 with heat sink plate 10 is also aided by the corner bosses 82 which bosses enter the corner holes 84 of the heat sink 10 as best seen in FIG. 5.

The cover plate 12 itself may have a shallow pan shape with a narrow lip 86 as this pan shape can effectively add to the decorative appearance and esthetic acceptability of the external heat sink element and cover plate element on a wall of a residence or other building where the control of power with solid state control elements is to be accomplished.

It will be realized, of course, that the particular shape of the heat sink shown in this illustration, which is that of a shallow rectangular dish form, is not essential to the present invention and the heat sink may have numerous forms. The heat sink plate 10 may, in fact, be used without the cover plate 12 although in many applications, the appearance features of a suitably formed cover plate would make such use desirable.

Similarly the appearance of the cover plate need not be just as shown and the cover plate can be eliminated entirely as by eliminating it from an assembly of components as shown in FIG. 8. Alternatively, it may have a number of other appearance features and still serve effectively as a cover plate.

Knob 14 is mounted to a shaft 22 in the conventional manner. Turning knob 14 about its axis and simultaneously turning shaft 22 about its axis effects a control of power passing through the dimmer in a manner well-known in the art.

I claim:

1. A dimmer article comprising:
   a. an insulating housing of a conventional dimmer having a top access opening and having side openings with electric supply means extending through said side openings,
   b. a metal closure plate of a conventional dimmer having forward and rear surfaces and mounted to said housing closing said top access opening,
   c. the forward surface of the portion of said closure plate closing said top access opening being flat,
   d. a solid state device mounted in electrically insulated heat transfer relation to the rear surface of said metal plate and electrically connected to said electric supply means,
   e. phase control circuitry in said housing controlling flow of electric power through said solid state device,
   f. a metal heat sink plate of a mass substantially greater than the mass of the closure plate,
   g. said heat sink plate having a rear flat surface portion physically bearing against most of the flat forward surface of the closure plate forward surface of the closure plate, of said conventional dimmer
   h. and said heat sink plate being mounted in close conforming and heat receiving contact with said closure plate to constitute said dimmer article.

2. The dimmer article of claim 1 in which the mass of the heat sink plate is at least five times larger than that of the closure plate.

3. The dimmer article of claim 1 in which the outer perimeter of the heat sink plate extends forward to give the plate the shape of a shallow dish.

4. The dimmer of claim 3 in which there is located in the face of the heat sink plate shaped as a shallow dish a second plate spaced from the heat sink plate.

* * * * *